United States Patent [19]

Perrotta et al.

[11] Patent Number: 4,892,693
[45] Date of Patent: Jan. 9, 1990

[54] METHOD OF MAKING FILAMENT GROWTH COMPOSITE

[75] Inventors: Anthony J. Perrotta, Monroeville; Donald K. Grubbs, Rector; William H. Quayle, Murrysville; Thomas B. Gurganus, New Kensington, all of Pa.

[73] Assignee: Aluminum Company of America, Pittsburgh, Pa.

[21] Appl. No.: 77,451

[22] Filed: Jul. 24, 1987

[51] Int. Cl.$^4$ .................. B22D 19/14; B32B 5/02
[52] U.S. Cl. .................. 264/108; 427/203; 164/97
[58] Field of Search ..... 427/203; 156/600, DIG. 112, 156/610; 164/97, 111; 264/DIG. 19, 108

[56] References Cited

U.S. PATENT DOCUMENTS

| 3,252,814 | 5/1986 | Russell et al. ............ 264/DIG. 19 |
| 3,580,731 | 5/1971 | Milewski et al. ............ 264/DIG. 19 |
| 3,622,272 | 11/1971 | Shyne .................. 156/612 |
| 3,653,830 | 4/1972 | Komeya et al. ............ 264/DIG. 19 |
| 4,155,781 | 5/1979 | Diepers .................. 156/DIG. 112 |
| 4,528,210 | 7/1985 | Noji et al. ............ 427/203 |
| 4,548,774 | 10/1985 | Akiyama et al. ............ 164/97 |
| 4,591,492 | 5/1986 | Tanaka et al. ............ 156/DIG. 112 |
| 4,595,637 | 6/1986 | Eaton et al. ............ 428/608 |
| 4,605,542 | 8/1986 | Harada .................. 156/DIG. 112 |
| 4,756,791 | 7/1988 | D'Angelo et al. ......... 156/DIG. 112 |

FOREIGN PATENT DOCUMENTS

| 97064 | 8/1978 | Japan .................. 427/203 |
| 141698 | 7/1985 | Japan .................. 156/DIG. 112 |
| 210600 | 10/1985 | Japan .................. 156/DIG. 112 |
| 1101499 | 5/1986 | Japan .................. 156/600 |
| 1236700 | 10/1986 | Japan .................. 156/DIG. 112 |
| 1291496 | 12/1986 | Japan .................. 156/DIG. 112 |
| 2003100 | 1/1987 | Japan .................. 156/DIG. 112 |
| 2087498 | 4/1987 | Japan .................. 156/DIG. 112 |
| 2113800 | 5/1987 | Japan .................. 156/DIG. 112 |
| 2138400 | 6/1987 | Japan .................. 156/DIG. 112 |
| 2162699 | 7/1987 | Japan .................. 156/DIG. 112 |

Primary Examiner—John J. Zimmerman
Attorney, Agent, or Firm—Daniel A. Sullivan

[57] ABSTRACT

A composite and a process for forming it are provided, said process comprising providing a substrate bearing crystalline and preferably single crystal filaments as growths on the substrate and forming a solid matrix encompassing the filaments. The composites are useful for aircraft, boat and auto skins and structural members.

21 Claims, 2 Drawing Sheets

METHOD OF MAKING FILAMENT GROWTH COMPOSITE

DESCRIPTION

1. Technical Field

This invention relates to the field of composite materials which are useful, for example, for aircraft, boat and auto skins and structural members.

2. Background of the Invention

Composites are combinations of two or more materials present as separate phases and combined to form desired structures so as to take advantage of desirable properties of each component. The constituents can be organic, inorganic, or metallic (synthetic or naturally occurring) in the form of particles, rods, fibers, plates, foams, and the like. Compared with homogeneous materials, these additional variables often Provide greater latitude in optimizing, for a given application, such physically uncorrelated parameters as strength, density, electrical properties, and cost. Furthermore, a composite may be the only effective vehicle for exploiting the unique properties of certain special materials such as the high strength and modulus of elasticity of graphite, boron, or aramid fibers.

DISCLOSURE OF INVENTION

Objects of the invention are to provide (1) new methods of manufacturing composite materials and (2) new composite materials.

These as well as other objects which will become apparent in the discussion that follows are achieved, according to the present invention, by (1) a method comprising providing a substrate bearing crystalline filaments as growths on the substrate and forming a solid matrix encompassing the filaments, and (2) by a composite comprising crystalline filaments on a substrate and a matrix encompassing the filaments, the filaments being distributed and oriented based on a history of having been borne as growths on said substrate at the time of matrix emplacement.

MODES FOR CARRYING OUT THE INVENTION

Introduction

Figure 1:
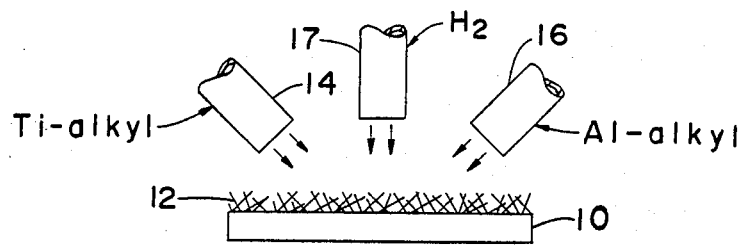
FIG. 1 is a schematic representation of an example of a method according to the invention.
Figure 3:
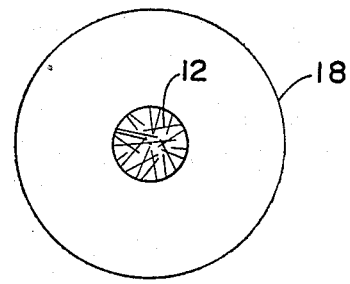
FIG. 3 is a cross-sectional view of tube 18.

FIG. 1 shows an example of the method of the invention being used to form a titanium aluminide composite sheet of titanium aluminide reinforced by a randomly interwoven network of filaments 12. Substrate 10 bears single-crystal filaments 12 as growths on the substrate. A titanium aluminide matrix is being emplaced to encompass the filaments, based on simultaneous flows of Ti-alkyl 14, Al-alkyl 16, and hydrogen 17 (employing an apparatus manufactured by Watkins Johnson Co., Scott Valley, CA), according to the reaction:

(1) $Ti(CH_2 Ph)_4 + Al(CH_3)_3 + nH_2 \rightarrow TiAl + $ Hydrocarbons (methane, benzene, toluene and ethane)

(2) $(C_5H_5)_2 TiCl_2 + Al(CH_3)_3 + nH_2 \rightarrow TiAl + 2HCl + $ Hydrocarbon (fragmented)

Figure 5:
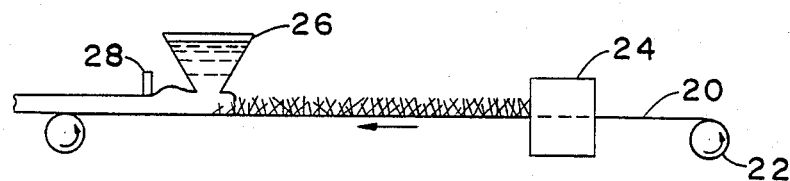
FIG. 5 is a schematic of a continuous sheet process.

FIG. 5 shows an example of a continuous process. Sheet substrate 20 from feed roll 22 is continuously fed to a filament growing station 24 where crystalline filaments are grown on the substrate 20)such as by the Gas Phase Method described below. The filament laden substrate is then advanced to dispenser 26 and treated with a liquid, normally molten, matrix material at dispenser 26 by a gravity dispenser, spray apparatus; evaporation apparatus (as disclosed in Metals Engineering Quarterly, Feb. 1974, p 1-5, in the article titled "Making Alloy Foils by Electron Beam Evaporation" by John L. Hughes), or the like, the deposited matrix allowed to solidify and the resultant coated product continuously recovered and cut to desired length. Depending on the intended use, the substrate may or may not be removed. A brittle substrate can be broken away and a pliable substrate simply peeled off. A soluble substrate can be dissolved away.

After removal of a brittle substrate, composite sheet of the invention can be formed between forming dies, such as used for automobile body sheet, to provide a contoured, rather than planar, surface.

Figures 6, 7:
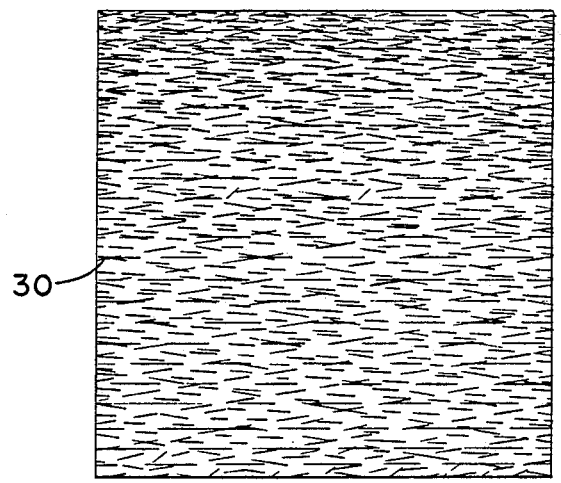
FIG. 6 is a side view of the filaments being compressed by passing the filament loaded substrate between rollers.
FIG. 7 is a top view of the filament loaded substrate of FIG. 6 in which the filaments are aligned in one plane.

FIG. 6 illustrates a process of improving the properties of a composite comprising a substrate bearing crystalline random filaments as growths on the substrate. Characteristic of this process is the aligning of a plurality of the filaments in substantially the same direction.

FIG. 6 is a side view of the filaments 12 being compressed by roller 30 to form a composite with the filaments lying in substantially one plane. Filaments can be made to withstand this rolling without breaking by making them of sufficient length and by spacing the rollers some distance greater than the substrate thickness such that the filaments do not undergo bending beyond their breaking limit during the rolling. Naturally, the material of the filaments also offsets bendability; a brittle core filament can be coated with a ductile cylindrical filament to increase bendability, e.g. aluminum on NaCl. A matrix may be formed around the filaments prior to their being aligned.

FIG. 7 is a top view of the composite formed in FIG. 6. The resultant directionality achieved by the rolling may be useful for purposes of strength or other characteristics such as conductivity based on the anisotropy of the single crystal filaments. As can be noted for instance from observation of FIG. 6, the directionality is in a direction other than perpendicular to the substrate.

In a preferred embodiment, two filament loaded substrates are placed on top of one another with the respective filaments placed at 90° angles to each other, and said substrates compressed together.

Filament Formation

Substrates with the preferred single-crystal filament growths on them can be manufactured by a number of different processes, such as the Gas Phase Method, the Gas-Liquid Solid Method, the Evaporation Method, and the Replication Method.

In order to prepare polycrystalline filaments, it is only necessary to vary slightly the conditions which produce single crystal filaments. For example, with the formation of aluminum filaments on a NaCl substrate, an evaporation rate slightly less than 330° A/sec at 380° C. will produce substantially all polycrystalline filaments whereas an evaporation rate less than about 130° A/sec will produce a mixture of orientations. Further, slightly higher pressures than those which produce single-crystal filaments will generally produce polycrystalline filaments, the pressure employed will depend on the materials employed. Other factors include the substrate temperature and orientation. Generally speaking, it is much more difficult to obtain single-crystal filaments and some reasonable experimentation may be required to optimize the conditions.

In the Gas Phase Method, an appropriate gas or gas mixture is passed over a substrate, and filaments grow from the substrate. An example of this method is given in U.S. Pat. No. 3,653,830, where fibrous aluminum nitride is grown on a carbon substrate.

U.S. Pat. No. 3,622,272 and an article by Milewski et al, titled "Growth of Beta-Silicon Carbide Whiskers by the VLS Process" (Journal of Materials Science 20, 1985, 1160–1167) Provide an example of a Vapor Liquid Solid Method (VLS method), in which silicon carbide whiskers are grown on graphite and silica substrates utilizing iron droplets on the substrates. Catalytic enhancement can be achieved by appropriate selection of catalytic droplets or particles.

In the Evaporation Method, a porous substrate, for instance, of alumina, is placed in contact with, for instance, an aqueous potassium chloride solution. Potassium chloride single crystals form on the air-side of the substrate.

According to the Replication Method, the potassium chloride single crystals can be plated by vapor-deposited titanium carbide. The potassium chloride can, if desired, be leached or melted out, leaving titanium carbide filaments.

Other methods may be difficult to classify. For example, U.S. Pat. No. 3,011,870 may be an example of the Gas Phase Method or the Gas-Liquid-Solid Method. In any event, alpha-alumina single crystals are grown on a substrate by the disproportionation of aluminum oxide into alpha alumina and aluminum metal.

Finally, other suitable single crystal growth techniques are taught by Bracke et al, Inorganic Fibers and Composite Materials, 61–75, 1984, Pergamon Press.

Filament Orientation

The filaments can be unidirectional or rise from the substrate surface to form a randomly interwoven network of single crystal filaments.

Filament Orientation—Crystalline Substrate

Single crystal filaments can be made to grow from a crystalline substrate to form a randomly interwoven network. For instance, where the filaments have the habit of growing along certain crystal directions of the substrate, a fine-grained substrate surface, such as can be obtained by forming the substrate by sintering fine powder, or by controlled recrystallization, or by grain refinement in the case of a cast substrate, will assure the formation of a randomly interwoven network. Surface roughness on the substrate, such as can be achieved by omitting the fines which would otherwise fill the interstices in a sintered substrate, by abrasion, or by arc cleaning (see FIG. 6 in U.S. Pat. No. 4,633,054), will likewise contribute to achieving this network, by exposing crystal directions tilted closer to the macroscopic plane of the substrate.

Filament Orientation—Amorphous Substrate

A randomly interwoven network can likewise be achieved on an amorphous substrate, where nucleation of single crystal filaments will tend inherently to be random. Surface roughening of the substrate will assist here also, to assure an adequate supply of filaments whose direction of growth approaches the macroscopic plane of the substrate.

Filament Orientation—Substrate Shape

Filament orientation can, as well, be influenced by substrate shape. For instance, filaments can be made to grow inwardly from the inner wall of a tube (FIG. 2), and, as the filaments become sufficiently long, they will interweave. On any given surface element of the wall, the single-crystal filaments on the element can extend from the wall in random directions. Superimposed on the character of filament orientation in the surface elements will be the effect introduced by the cylindrical character of the tube inner wall.

Following the desired filament growth on the tube inner wall, molten matrix material can be introduced into the tube and frozen there, to form a composite material in the form of a rod-shaped core within the substrate.

If the substrate tube is of brittle nature, as compared to the composite core, the substrate can be shattered away, to release the core as an end product in the form of a rod.

Figure 4:
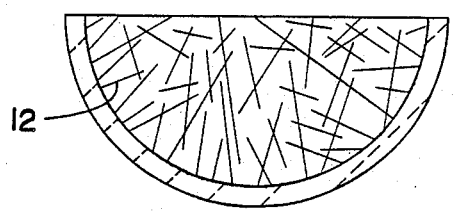
FIG. 4 is a hemisphere or semicylinder.

Besides the use of a tube, the substrate may also be shaped, by conventional forming die technology, in any desirable form such as a boat, or trough, or groove, whose inner wall may have the shape of a hemisphere or semicylinder, box or polygonal shell (FIG. 4).

Substrates

Substrates for use in the invention can be formed from a number of materials. Typical substrates include graphite, silica, and alumina, and the substrate material may be the same as the filament.

Filaments

Typical filaments for use in the invention are formed from glass, graphite, organic textile fibers, and inorganic fibers made from iron, copper, chromium, tin, zinc, alumina, silicon, silicon carbide, silicon nitride, sodium chloride, and the like.

Matrices

The typical matrices can be used in the invention and include, for example, polymers, metals, cements, glasses and ceramics. Thermosetting resins are particularly convenient because they can be applied in a fluid state and cured when desired. Most of the same materials employed as filaments can be employed as matrices.

For aircraft use, matrices are typically formed of aluminum, titanium, magnesium and vanadium, and tin or molybdenum as the third component. Reinforcing fibers such as alumina and silicon carbide may be employed.

Carbon or carbide (e.g. SiC) fibers may be treated with flourine compound as in WO 8,303,625 (PCT patent application) or French Pat. Nos. 2,525,240 and 2,533,150 to improve wetting by aluminum alloys during impregnation to form the matrix.

For matrices to contain a variety of materials, epoxy resins are commonly employed. They can bond to metals, glass or ceramics, as well as wood, fabrics or other materials. The action of a curing agent, usually a polyamine or a polyamide causes cross linking. Other all purpose organic polymers useful as matrix materials are the alkyd resins. These compounds are polyesters of acids containing at least two carboxyl groups, and polyhydric alcohols. A typical resin is formed from phthalic acid and glycerol. Examples of materials and molding means are illustrated by U.S. Pat. Nos. 4,279,289 and 4,560,603.

Reinforcements

If desired, a reinforcement can be added to the matrix. Typical materials include natural fibers such as plant fibers (vegetable), silk and asbestos. Other suitable fibers include glass and organic polymers such as aramid, olefin, nylon and rayon. Suitable inorganic fibers are formed from alumina, alumina silicates, boron, boron nitride, silicon carbide, silicon nitride and zirconia. Suitable metals are formed from beryllium, molybdenum, steel and tungsten.

EXAMPLES

The following examples will serve to illustrate the Preparation of typical filaments for use in the composites of the invention. All parts and percentages are by weight unless otherwise indicated.

Figure 2:
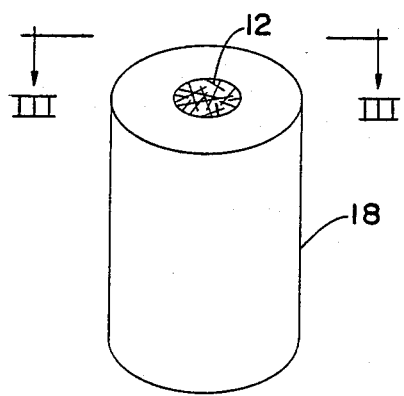
FIG. 2 is a tube 18 with filaments 12 grown from inside.

A device as shown in FIG. 2 was prepared as follows. After purging for ½ hour with argon and nitrogen, a graphite crucible, with a ¾" diameter hole 2" long cut out was charged with 400 g of 50/50 w/w mixture of aluminum nitride and aluminum powder. The crucible was gradually heated to 1625° C. over 2 hours and 10 minutes and a good growth of thick transparent aluminum nitride random filaments formed on the inside of the crucible.

The above procedure was repeated employing alumina plates contained in an alumina boat with 10 g 40×80 mesh aluminum metal. After 2 hours at a top temperature of 1640° C. a good growth of aluminum nitride uni-directional filaments was formed on the plates.

Composite Formulation

In forming the composites, it is desireable to have by volume from about 10% filament (to include about 90% matrix) to about 50% filament (about 50% matrix) or preferably from about 40% to about 50% filament. Higher filament loadings provide increased strength to the composite.

Another preferred embodiment is to use filaments with a length of at least 30 cm (1 ft.) and a diameter of at least about 100N (0.004") or an aspect ratio (length to diameter ratio) of greater than 100:1. Conventional application methods can be employed to apply the matrix to include liquid, vapor, molecular infiltration, and pultrusion with the application of pressure, if desired, to increase density to inhibit filament breaking, the filaments are preferably coated, either with the matrix or another material, prior to processing such as by compressing and rolling. Further, the matrix material may not penetrate the filaments unless it is applied before processing involving compression or rolling.

Other means to coat the filaments include epitaxial growth and evaporation of a metal. By selecting compatible materials, (i.e. ones with similar crystal structure) one material can be made to grow on the other with both having substantially the same crystal orientation.

For example, in a paper by Yellin et al, titled CA Membranes as Habit Modifiers for the Growth of Whiskers of Inorganic Salts (Journal of Materials Science 21, 1986, 504–506), is reported the formation of single crystal filaments from a large number of soluble inorganic salts such as KCl, NaCl and KBr utilizing cellulose acetate membranes. Further, both inorganic salts as wells as organic materials have been used to grow single crystal filaments on porous glass and cellulose acetate membranes. (Yellin et al, Whisker Growth by Means of Porous Glass, Journal of Materials Science Sept. 21, 1986, 2648–2650).

While the above filaments are all useful in the invention, potentially more useful filaments are made of a metal such as aluminum formed on rocksalt. (Dumpich et al, Epitaxial Growth of Aluminum on Contaminated NaCl and KBr Cleavage Surfaces, Surface Science 33, 1972, 203–208).

In accordance with the invention, a novel fiber is provided comprising an epitaxial growth with the crystal orientation determined by an underlying substrate. The fiber can be two layered or the substrate can be removed such as by dissolution. A non-limiting example is the formation of aluminum on salt filaments. They can be used in the composite as is or the salt can be leached out with water or other solvent. With multiple epitaxy such as SiC/Si/NaCl, the NaCl is removed by aqueous dissolution. The silicon dissolves in the aluminum matrix thus providing silicon carbide filaments in a silicon containing aluminum alloy composite. Other metals that have been employed are copper, silver, and gold. (Wagner, Epitaxial Growth of Copper, Silver, Gold and Aluminum Evaporated Films of Different Orientations on Rocksalt, Surface Science 41, 1974, 591–594.)

In order to prepare the epitaxial filaments, the above procedures are altered in that the rocksalt is formed as a filament using the Evaporation Method. One subsequently proceeds as in Wagner to deposit epitaxial aluminum on the sodium chloride filaments.

The epitaxial filaments can be impregnated with matrix material while still on the substrate, or they can be removed and mixed, as loose whiskers, with matrix for forming composite materials.

Composites of improved isotropic strength are prepared by employing two laminates in which one of two substantially identical sheets is placed on top of the other with the respective fibers oriented transversely or preferably at substantially 90° to one another. The sheets are then bonded together.

Isotropic properties can be obtained in all directions by forming composites both with oriented fibers as described above and also by blending with a reinforcing metal powder such as aluminum. The resultant product would then be compressed and sintered or hot pressed.

The fibers can be aligned by rolling and compressing the filaments to orient said filaments in the general direction of the applied force.

Metal matrix composites are preferred which are formed of a matrix phase with a metal such as aluminum, magnesium, titanium, copper, and superalloys; and a reinforcement phase. The reinforcement phase can be formed of continuous fibers, discontinous fibers, whiskers, particulates, platelets, and wires. The reinforcement phase, with the exception of wire, is preferably a ceramic. Because of the superior mechanical properties and unique physical characteristics such as low coefficients of thermal expansion and improved wear resistance, metal matrix composites are attractive for both structural and nonstructural applications. The properties of metal matrix composites can be varied widely depending upon reinforcement type, reinforcement volume loading, and matrix type.

Metal matrix composites can be produced by a variety of methods. Primary fabrication methods such as squeeze casting and pressure infiltration are used to produce the metal matrix composite from its constituents. The resultant product of the primary fabrication may be in a form close to final configuration or it may require additional processing (secondary fabrication) such as metal working, bonding, and machining. A typical example of such a process is the production of near net shape metal matrix composites by infiltrating liquid metal into a prearranged fibrous configuration. Such a process, when done under pressure, is often called squeeze casting. Another typical example is the production of metal matrix composite billets for additional secondary processing. In this case, the reinforcements are blended into powdered metals and hot pressed into billets.

The composites prepared by the invention can be used for conventional uses such as aircraft, boat and auto skins.

All patents and other citations referred to herein are incorporated by reference in their entirety.

While the invention has been described in terms of preferred embodiments, the claims appended hereto are intended to encompass all embodiments which fall within the spirit of the invention.

What is claimed is:

1. A process for forming a novel composite comprising providing a substrate bearing crystalline filaments as growths on the substrate and forming a solid matrix encompassing the filaments, wherein the filaments are substantially uni-directional in a direction other than perpendicular to the substrate.

2. The process of claim 1 wherein the filaments are substantially single crystal.

3. The process of claim 1 wherein the filaments are substantially polycrystalline.

4. The process of claim I wherein substrate is removed following the step of forming.

5. The process of claim 1 wherein the substrate becomes part of the matrix.

6. The process of claim 1 wherein the filaments comprise from between about 10 and about 50% by volume.

7. The process of claim 1 wherein a plurality of the filaments have an aspect ratio greater than 100:1.

8. The process of claim 1 wherein the filaments are coated.

9. A continuous process for forming a novel composite comprising continuously feeding a suitable substrate to a filament growing station and forming crystalline filaments on said substrate, passing the resultant filament laden substrate to a matrix dispenser station and treating said filament laden substrate with a liquid, normally molten, matrix material, allowing the resultant coated product to solidify and continuously recovering the solid product wherein the filaments are substantially uni-directional in a direction other than perpendicular to the substrate.

10. The process of claim 9 wherein single crystal filaments are formed.

11. The process of claim 9 wherein the filaments are grown by the Gas Phase Method.

12. The process of claim 9 wherein the filaments are grown by the VLS method.

13. The process of claim 9 wherein the filaments are grown by the membrane-epitaxial growth method.

14. The process of claim 9 wherein substrate is removed following the step of allowing.

15. The process of claim 9 wherein the filaments are random as formed but are in a substantially uni-directional manner after solidification of the matrix material.

16. A process of improving the properties of a composite comprising a substrate bearing filaments as growths on the substrate, said process comprising aligning a plurality of said filaments in substantially the same direction.

17. The process of claim 16 wherein the filaments are substantially single crystal.

18. The process of claim 16 wherein the aligning is accomplished by means of one or more rollers passed over said filaments to compress and orient said filaments.

19. The process of claim 16 wherein a matrix is formed around said filaments prior to aligning said filaments.

20. The process of claim 16 wherein the substrate submitted to the step of aligning is a substrate bearing crystalline ransom filaments as growths on the substrate.

21. The process of claim 20 wherein the aligning is accomplished by means of one or more rollers passed over said filaments to compress and orient said filaments.

* * * * *

UNITED STATES PATENT AND TRADEMARK OFFICE
CERTIFICATE OF CORRECTION

PATENT NO. : 4,892,693

DATED : January 9, 1990

INVENTOR(S) : Anthony J. Perrotta et al

It is certified that error appears in the above-identified patent and that said Letters Patent is hereby corrected as shown below:

Title page:

References Cited (Issue date for
  U.S. Patent 3,252,814)         Change "5 - 1986" to --5 - 1966--.

References Cited (Japanese
  Patent Number)                Change "97064" to --97069--.

Column 8, line 45               Change "ransom" to --random--.

Signed and Sealed this

Twenty-third Day of June, 1992

Attest:

DOUGLAS B. COMER

*Attesting Officer*          *Acting Commissioner of Patents and Trademarks*